United States Patent [19]

Kawaberi et al.

[11] Patent Number: 5,343,100
[45] Date of Patent: Aug. 30, 1994

[54] THYRISTOR IGNITION CIRCUIT

[75] Inventors: Seiji Kawaberi, Kanagawa; Takeshi Shoji, Chiba, both of Japan

[73] Assignee: Sony Corporation, Tokyo, Japan

[21] Appl. No.: 956,346

[22] Filed: Oct. 5, 1992

[30] Foreign Application Priority Data

Oct. 14, 1991 [JP] Japan ................... 3-293739

[51] Int. Cl.$^5$ .................. H03K 17/72; H03K 17/723
[52] U.S. Cl. .................................... 307/646; 307/638
[58] Field of Search .............. 307/630, 638, 639, 643, 307/646, 645, 632

[56] References Cited

U.S. PATENT DOCUMENTS

| | | | |
|---|---|---|---|
| 2,745,038 | 5/1956 | Sziklai | 307/305 |
| 3,551,700 | 12/1970 | Greenan . | |
| 4,225,809 | 9/1980 | Ogawa et al. | 315/371 |
| 4,234,824 | 11/1980 | den Hollander | 315/571 |
| 4,663,547 | 5/1987 | Baliga et al. | 307/630 |
| 4,687,950 | 8/1987 | Howell . | |

FOREIGN PATENT DOCUMENTS

| | | | |
|---|---|---|---|
| 1290187 | 3/1969 | Fed. Rep. of Germany | H03K 17/725 |
| 52-118551 | 5/1977 | Japan | H03K 17/72 |

*Primary Examiner*—John Zazworsky
*Attorney, Agent, or Firm*—Lewis H. Eslinger; Jay H. Maioli

[57] ABSTRACT

In a thyristor ignition circuit, a forward voltage drop occurring in a signal path of an anode and a gate of a thyristor is reduced. An anode of a thyristor of the thyristor ignition circuit is connected to one signal terminal, and a gate thereof is connected to another signal terminal. The thyristor ignition circuit further comprises a transformer having a primary winding for receiving an ignition signal, and a first secondary winding having one end connected to a cathode of the thyristor and the other end connected to the other signal terminal. The thyristor is ignited via the cathode in response to the ignition signal applied to the transformer. A signal path is established between one signal terminal and the other signal terminal through the anode-to-gate path.

4 Claims, 6 Drawing Sheets

TV screen

FIG. 8

THYRISTOR IGNITION CIRCUIT

BACKGROUND OF THE INVENTION

1. Field of the Invention

The present invention generally relates to a thyristor ignition circuit. More specifically, the present invention is directed to a thyristor ignition circuit suitable for switching a switching element employed in, for instance, a television receiver in order to correct vertical deflection distortion.

2. Description of Prior Art

Figure 1:
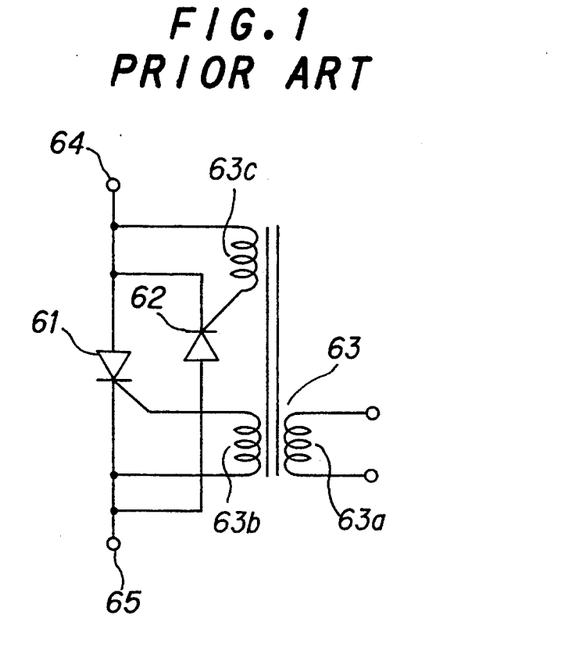
FIG. 1 is a circuit diagram of one conventional thyristor ignition circuit.

To correct pincushion distortion occurring in a television receiver, a parabolic current is produced by switching a switching element. Normally, when a thyristor is employed as this switching element, for example, the pincushion correction circuit is arranged as shown in FIG. 1. In this thyristor pincushion correction circuit, both of thyristors 61 and 62 are connected between one signal terminal 64 and the other signal terminal 65 in such a manner that an anode of one thyristor 61 is connected to a cathode of the other thyristor 62, and similarly an anode of the other thyristor 62 is connected to a cathode of the first thyristor 61 (so-called "cross-coupling connection"). When a predetermined pulse is inputted to a primary coil 63a of a transformer 63, pulses are outputted from secondary coils 63b and 63c thereof.

With this circuit arrangement, when a predetermined pulse is applied to the primary coil 63a of the transformer 63, the pulses are derived from the secondary coils 63b and 63c, respectively, and then these pulses are supplied to gates of the above-described thyristors 61 and 62. As a result, these thyristors 61 and 62 are turned ON. Accordingly, for example, a current of a positive direction flows from one signal terminal 64 through the anode-to-cathode path of one thyristor 61 to the other signal terminal 65, whereas another current flows from one terminal 65 via the anode-to-cathode path of the other thyristor 62 to the other signal terminal 64.

Figure 2:
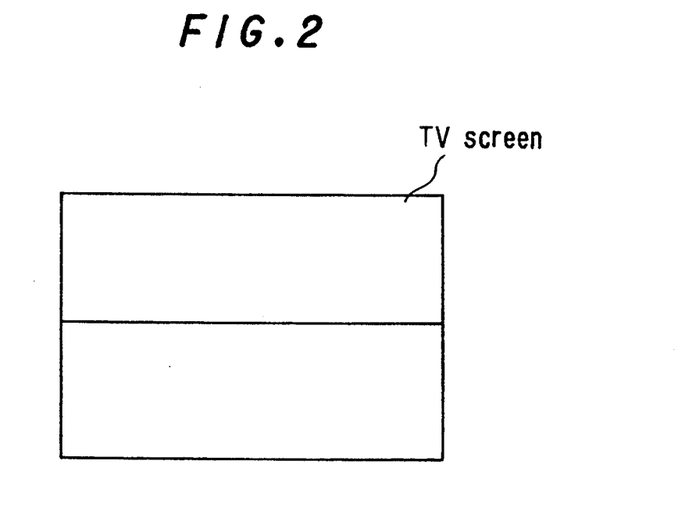
FIG. 2 schematically illustrates an adverse influence appearing on a television screen caused by insensitivity of thyristors employed in the conventional thyristor ignition circuit shown in FIG. 1.

However, when these thyristors are ignited via the gate electrodes thereof by these ignition pulse, a horizontal line appears on a screen of a television receiver, as represented in FIG. 2, due to insensitivity of the thyristors (which will be discussed later).

SUMMARY OF THE INVENTION

The present invention has been made in order to solve the above-described problems of the conventional pincushion correction circuit, and therefore, has an object to provide a thyristor ignition circuit suitable for a television receiver, having no horizontal line appearing on a TV screen.

To achieve the above-described object and other features of the present invention, a thyristor ignition circuit, according to the present invention, comprises:

a thyristor 40 or 41 whose anode is connected to one signal terminal and whose gate is connected to the other signal terminal; and a transformer 44, one terminal of which is connected to a cathode of the thyristor 40 or 41, and the other terminal of which is connected to the other signal terminal, whereby the thyristor 40 or 41 is ignited by the transformer 44.

In the thyristor ignition circuit with the above-described circuit arrangement, an ignition pulse (control signal) is supplied to the primary coil 44c of the transformer 44, and ignition pulses produced from the secondary coils 44a and 44b thereof are applied between the gates and cathodes of the thyristors 40 and 41. As a consequence, the thyristors 40 and 41 are ignited. Accordingly, a forward voltage drop in the signal path becomes small. If such a thyristor ignition circuit is employed in a deflection distortion correction circuit, or the like, it can be prevented that a horizontal line appears on a television screen.

BRIEF DESCRIPTION OF THE DRAWINGS

For a better understanding of the present invention, reference is made of the following descriptions in conjunction with the accompanying drawings, in which.

DETAILED DESCRIPTION OF THE PREFERRED EMBODIMENTS

Figure 3:
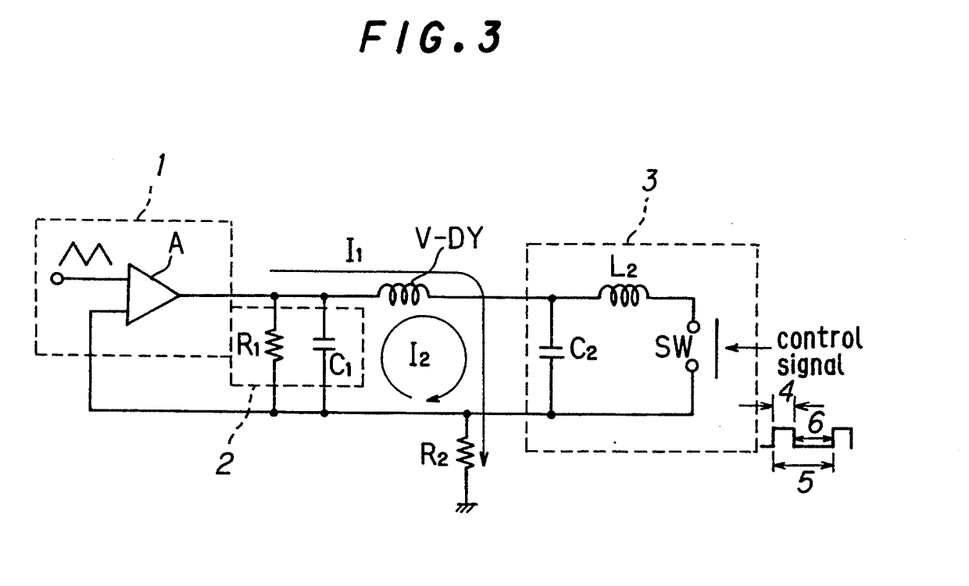
FIG. 3 is a circuit diagram for representing an arrangement of a deflection distortion correction circuit into which a thyristor ignition circuit of the present invention has been incorporated.

FIG. 3 is a circuit diagram of a deflection distortion correction circuit according to a preferred embodiment of the present invention, into which a thyristor ignition circuit of the present invention is incorporated. In FIG. 3, a vertical deflection output circuit 1 including an amplifier "A" is connected to a vertical deflection yoke V-DY and a damping circuit 2. A resistor R1 is connected parallel to a capacitor C1, which constitute the damping circuit 2. A coil $L_2$ is connected parallel to a capacitor $C_2$ via a switch SW, which constitute a resonance circuit 3. The resonance circuit 3 is connected to the vertical deflection yoke V-DY and the damping circuit 2. Both of the damping circuit 2 and the resonance circuit 3 are grounded via a current detecting circuit $R_2$. A vertical deflection circuit $I_1$ is a sawtooth-shaped current outputted from the vertical deflection output circuit 1, and a parabolic current $I_2$ is a correction current flowing through the damping circuit 2, vertical deflection yoke V-DY and resonance circuit 3. The switch SW is turned ON/OFF by a control signal. The control signal is varied at a horizontal deflection period 5, and becomes a logic "H" level during a flyback period 4 and also a logic "L" level during the remaining scanning period 6.

Operation of the deflection distortion correction circuit according to the preferred embodiment will now be described. The sawtooth current $I_1$ derived from the vertical deflection output circuit 1 flows through a signal path of the vertical deflection yoke V-DY, the resonance circuit 3 and the resistor R2. At this time, energy is reserved in the capacitor C2. The switch SW is turned ON during the horizontal flyback period 4, and also electron charge stored in the capacitor C2 is discharged via the coil L2 during this flyback period 4. Thereafter, even after a voltage across the capacitor $C_2$ becomes 0 (zero), the current of the resonance circuit 3 continues to flow because of the resonance phenomenon by the coil $L_2$ and the capacitor $C_2$. However, a circuit constant of this circuit is so designed that when the current of the coil $L_2$ becomes zero, the switch SW is turned OFF in response to the control signal. At this time, a pulse voltage produced between both ends of the capacitor $C_2$ is directly proportional to the vertical deflection current $I_1$, and a polarity of the pulse voltage corresponds to that of the vertical deflection circuit $I_1$.

During the horizontal scanning period 6, the switch SW is turned OFF, and then the resonant parabolic current $I_2$ flows through the signal path of the vertical deflection yoke V-DY, the resonance circuit 3 (capacitor $C_2$), and the damping circuit 2.

It should be noted that the damping circuit 2 bypasses the parabolic current $I_2$ changing at the horizontal deflection period with respect to the vertical deflection output circuit 1. As a consequence, it is possible to avoid an oscillation and a ringing effect of the current flowing through the vertical deflection yoke V-DY. If there is no damping circuit 2, since a voltage of approximately 160V is produced across the terminals of the vertical deflection yoke V-DY, the amplifier "A" of the vertical deflection output circuit 1 must withstand such a high voltage. However, if the damping circuit 2 is connected to this deflection distortion correction circuit, since the parabolic circuit $I_2$ flows as represented in FIG. 2, a voltage, e.g., on the order of 50V is applied to the amplifier "A".

Figure 4:
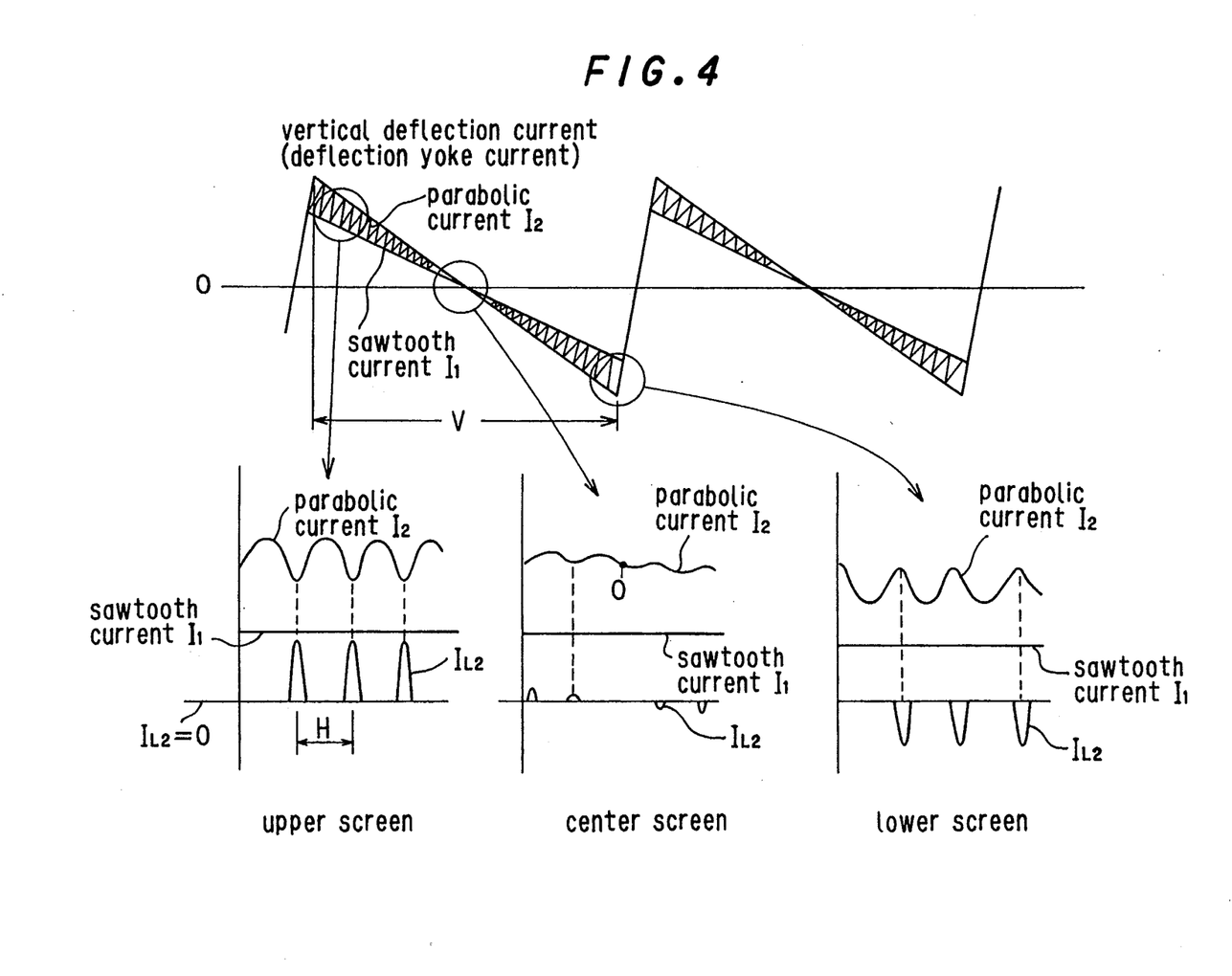
FIG. 4 is a waveform chart of currents flowing at various circuit portions of the deflection distortion correction circuit shown in FIG. 3.

In FIG. 4, there are shown waveforms of currents flowing through the vertical deflection yoke V-DY. As represented in FIG. 4, the sawtooth current $I_1$ is varied at the vertical deflection period. Then, the parabolic current $I_2$ is superimposed on this sawtooth current $I_1$. A level of this parabolic current $I_2$ becomes high when a level of the sawtooth current $I_1$ becomes high, and conversely, when the level of the sawtooth current $I_1$ becomes low, the level of the parabolic current $I_2$ becomes low. Also, when the polarity of the sawtooth current $I_1$ becomes positive, the polarity of the parabolic current $I_2$ becomes similarly positive. When the polarity of the sawtooth current $I_1$ becomes negative, that of the parabolic current $I_2$ becomes negative. In this preferred embodiment, since it is so designed that the polarity of the sawtooth current $I_1$ becomes positive at an upper portion of a television screen and becomes negative at a lower portion of the screen, the polarity of the parabolic current $I_2$ becomes positive at the upper portion of the screen and negative at the lower portion of the screen. Then, the levels of the sawtooth and parabolic currents become substantially zero at a center portion of the screen. As apparent from FIG. 4, a pulsatory current $IL_2$ flows through the coil L when the switch SW is turned ON during the horizontal flyback period.

As previously explained, since the vertical deflection current having the sawtooth shape and varied at the vertical deflection period flows on which the parabolic correction current changing at the horizontal deflection period is superimposed, the vertical pincushion distortion can be corrected.

Figure 5:
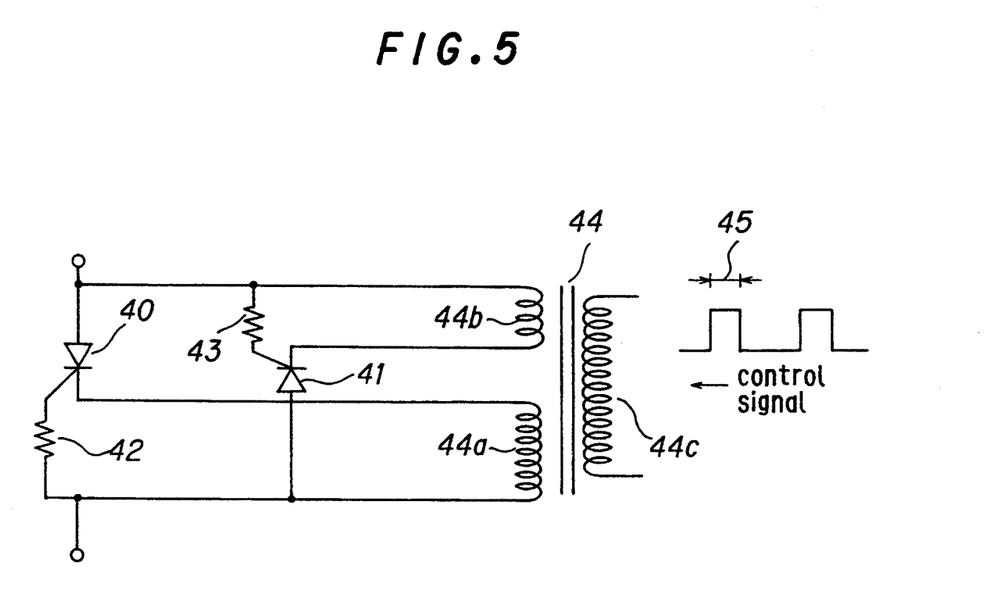
FIG. 5 is a circuit diagram for showing an arrangement of a thyristor ignition circuit according to one preferred embodiment of the present invention.

Now, a description will be made of a concrete circuit arrangement of the switch SW shown in FIG. 3. FIG. 5 represents an example of a circuit arrangement in which a thyristor (SCR) is utilized as the switch SW of FIG. 3. In this circuit arrangement of FIG. 5, an anode of a thyristor 40 is connected to one signal input terminal and a gate of this thyristor 40 is connected via a resistor 42 to the other signal input terminal. Then, a cathode of the thyristor 40 is connected to one terminal of a secondary coil 44a of a transformer 44, and the other terminal of the secondary coil 44a is connected to the other end of the resistor 42 (namely, the other signal input terminal). Similarly, a gate of another thyristor 41 is connected via a resistor 43 to one signal input terminal, and an anode of this thyristor 41 is connected to the other signal input terminal. A cathode of the thyristor 41 is connected to one terminal of a secondary coil 44b of the above-explained transformer 44, and the other terminal of this secondary coil 44b is connected to both of the resistor 43 and one signal input terminal. Then, a predetermined control signal is supplied from a primary coil 44c of the transformer 44.

A control signal (pulse signal) is inputted to the primary coil 44c of the transformer 44 and then pulses are produced from the secondary coils 44a and 44b. These pulses are applied to the cathodes of the respective thyristors 40 and 41. As a result, the thyristors 40 and 41 are turned ON, so that, for instance, a positive-direction current flows from one signal input terminal via the anode of the thyristor 40, the gate thereof and the resistor 42 to the other signal input terminal, and also a negative-direction signal flows from the other signal input terminal via the anode of the thyristor 41, the gate Thereof and the resistor 43 to one signal input terminal.

Figure 6A:
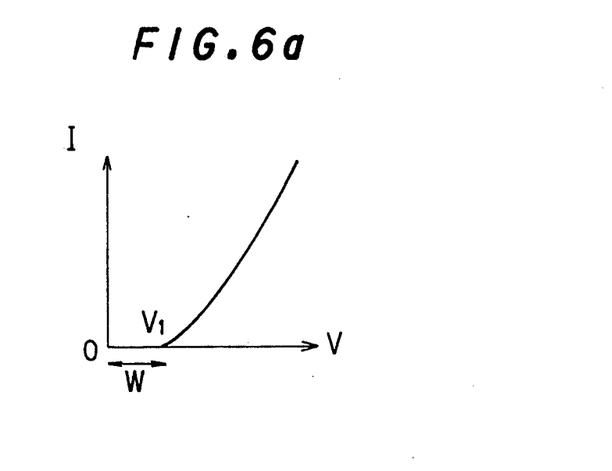
FIGS. 6a and 6b are explanatory diagrams for explaining insensitivity of the thyristors.
Figure 6B:
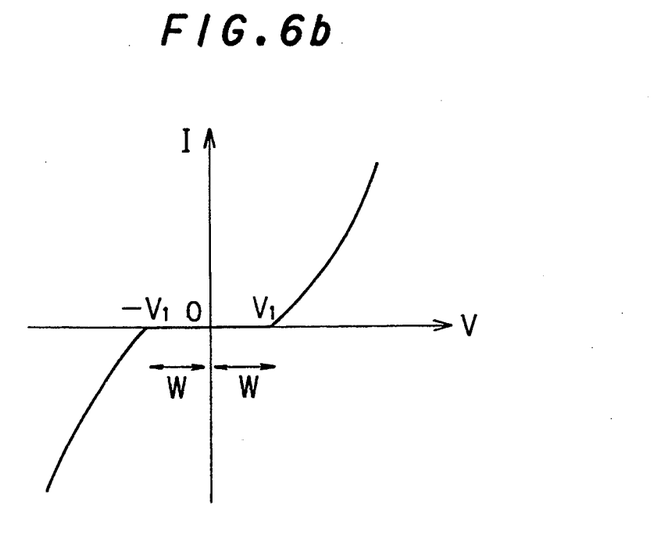

In general, a thyristor is ignited by applying a predetermined voltage between a gate of this thyristor and a cathode thereof. Then, as shown in FIG. 6a, when this applied voltage exceeds a predetermined voltage "$V_1$", the thyristor is turned ON. In other words, an insensitivity period W of a thyristor is defined by that voltage between the gate and the cathode and until cathode reaches a predetermined voltage $V_1$. As a consequence, in case that the currents flow in both of the positive and negative directions with employment of two thyristors 40 and 41, as represented in FIG. 5, insensitivity as defined by a period of $\pm W$ is produced (see FIG. 6b). That is to say, in order to continuously flow a current by sequentially changing a voltage, for instance, when the voltage is gradually increased from the negative direction and reaches "$-V_1$", this voltage must be varied up to "$+V_1$" in a stepwise form at the next instant. If such a stepwise voltage increase is not employed, since a pitch of a scanning line on a screen is locally varied at this insensitivity portion (namely, higher density), for instance, the horizontal line will appear on this screen as illustrated in FIG. 2.

Figure 7:
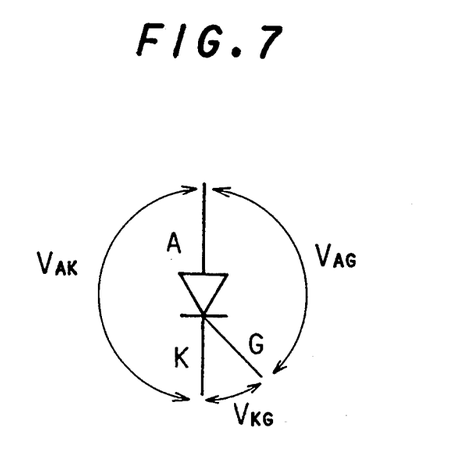
FIG. 7 is an explanatory diagram for explaining voltage differences among the anode, cathode and gate of the thyristor.

In accordance with this preferred embodiment, to avoid such a conventional problem, the thyristors 40 and 41 are not ignited via the gates thereof, but ignited via the cathodes thereof. In other words, as shown in FIG. 7, assuming now that an anode of a thyristor is indicated by "A", a cathode thereof is denoted by "K", and a gate thereof is shown by "G", and also a voltage between the anode and the cathode is represented by "$V_{AK}$", a voltage between the cathode and the gate is indicated by "$V_{KG}$", and a voltage between the anode and the gate is denoted by "$V_{AG}$", when comparisons are made in these voltages, the voltage $V_{AK}$ between the anode and the cathode is the highest voltage among the voltages $V_{KG}$ and $V_{AG}$. Then, the voltage $V_{KG}$ between the cathode and the gate is the second highest voltage, and the voltage $V_{AG}$ between the anode and the gate is the lowest voltage. As previously explained, since the signal path between the anode and the gate is employed in this preferred embodiment, a forward voltage drop between the anode and the gate becomes minimum. As a consequence, a width of the insensitivity can be made narrow, a width of a voltage which is stepwise varied (a width "±W" shown in FIG. 6) can be also made narrow in case that the current flows in both of the positive and negative directions as indicated in FIG. 3. As a result, even when a signal which is stepwise changed is applied to the primary coil 44c of the transformer 44, the thyristors 40 and 41 can quickly respond to this stepwise signal, so that it can be prevented that the horizontal line appears on the screen as shown in FIG. 2.

Figure 8:
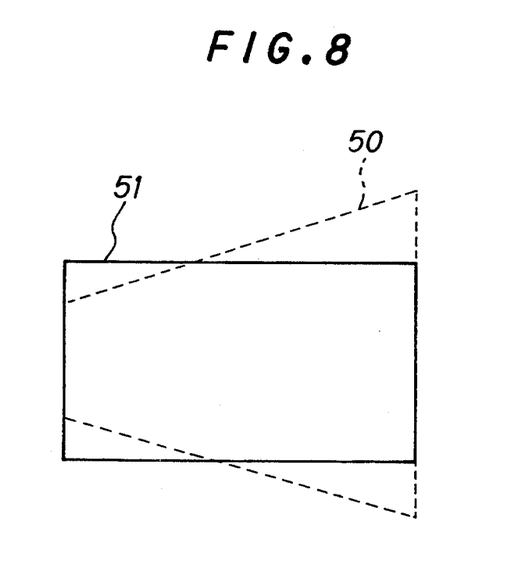
FIG. 8 is an explanatory diagram for explaining horizontal trapezoidal distortion.

As previously stated, in this preferred embodiment, the parabolic correction current which is superimposed on the sawtooth current is produced by switching the switch SW. Thus, a horizontal trapezoidal distortion as indicated in FIG. 8 can be corrected by properly adjusting the switching timing of the switch SW. That is to say, as illustrated in FIG. 8, to correct a raster 50 having horizontal trapezoidal distortion such that the height of the righthand screen becomes high, and the height of the lefthand screen becomes low, as a correct raster 51, the generation timing of the parabolic wave at the horizontal scanning period is set to be fast. Conversely, to correct a horizontal trapezoidal distortion such that the height of the lefthand screen becomes high and the height of the righthand screen becomes low, the generation timing of the parabolic wave is delayed.

While the thyristor ignition circuit according to the resent invention has been described in detail, since the signal input terminals are connected between the anode of the thyristor and the gate thereof, and also the thyristor is ignited via the cathode thereof, the forward voltage drop in the signal path between the anode and the gate can be lowered. As a result, when this ignition circuit is employed in the upper/lower pincushion distortion correction circuit, the problem that the horizontal line appears on the screen can be prevented.

What is claimed is:

1. A thyristor ignition circuit comprising:
   a first signal terminal;
   a second signal terminal;
   a first thyristor having an anode connected to said first signal terminal, a gate connected to said second signal terminal, and a cathode;
   a second thyristor having an anode connected to said second signal terminal, a gate connected to said first signal terminal, and a cathode; and
   a transformer comprising a primary winding for receiving an ignition signal, and a first secondary winding having one end connected to said cathode of the first thyristor and another end connected to said second signal terminal, said transformer further including a second secondary winding having one connected to said cathode of the second thyristor and the other end connected to said first signal terminal, whereby said first thyristor and said second thyristor are cross-coupled with each other between said first signal terminal and said second signal terminal and said first signal terminal is connected to said second signal terminal via a signal path including said anode and said gate of said first thyristor, and said first thyristor is ignited by said cathode in response to said ignition signal applied to said primary winding and said second signal terminal is connected to said terminal via a signal path including said anode and said gate of said second thyristor, and said second thyristor is ignited by said cathode in response to said ignition signal applied to said primary winding.

2. A thyristor ignition circuit as claimed in claim 1 further comprising:
   a resistor interposed between said gate of the first thyristor and said second signal terminal.

3. A thyristor ignition circuit as claimed in claim 1, further comprising:
   a resistor interposed between said gate of the second thyristor and said first signal terminal.

4. A thyristor ignition circuit as claimed in claim 1 wherein said ignition signal is a rectangular signal whose signal level is changed stepwise.

* * * * *

UNITED STATES PATENT AND TRADEMARK OFFICE
CERTIFICATE OF CORRECTION

PATENT NO. : 5,343,100
DATED : August 30, 1994
INVENTOR(S) :
 Seiji Kawaberi and Takeshi Shoji It is certified that error appears in the above-indentified patent and that said Letters Patent is hereby corrected as shown below:

Col. 1, line 42, change "pulse" to --pulses--

Col. 4, line 36, change "Thereof" to --thereof--
      line 43, delete "and" second occurrence
      same line, after "until" insert --the--

Col. 5,
      line 39, change "resent" to --present--

Col. 6, line 19, after "one" insert --end--
      line 30, after "said" insert --first signal--

Signed and Sealed this

Thirty-first Day of October 1995

Attest:

BRUCE LEHMAN

*Attesting Officer*    *Commissioner of Patents and Trademarks*